US012031047B2

(12) United States Patent
Sun et al.

(10) Patent No.: US 12,031,047 B2
(45) Date of Patent: Jul. 9, 2024

(54) HIGHLY CONDUCTIVE, PRINTABLE INK FOR HIGHLY STRETCHABLE SOFT ELECTRONICS

(71) Applicant: KARLSRUHER INSTITUT FÜR TECHNOLOGIE, Karlsruhe (DE)

(72) Inventors: Hongye Sun, Karlsruhe (DE); Norbert Willenbacher, Kirchheimbolanden (DE); Zongyou Han, Karlsruhe (DE)

(73) Assignee: KARLSRUHER INSTITUT FÜR TECHNOLOGIE (DE)

( * ) Notice: Subject to any disclaimer, the term of this patent is extended or adjusted under 35 U.S.C. 154(b) by 743 days.

(21) Appl. No.: 17/276,863

(22) PCT Filed: Sep. 24, 2019

(86) PCT No.: PCT/EP2019/075692
§ 371 (c)(1),
(2) Date: Mar. 17, 2021

(87) PCT Pub. No.: WO2020/074251
PCT Pub. Date: Apr. 16, 2020

(65) Prior Publication Data
US 2022/0025201 A1 Jan. 27, 2022

(30) Foreign Application Priority Data
Oct. 12, 2018 (EP) .................... 18200100

(51) Int. Cl.
*C09D 11/00* (2014.01)
*C09D 11/03* (2014.01)
(Continued)

(52) U.S. Cl.
CPC .............. *C09D 11/52* (2013.01); *C09D 11/03* (2013.01); *C09D 11/101* (2013.01); *H01B 1/22* (2013.01)

(58) Field of Classification Search
CPC ....... C09D 11/52; C09D 11/03; C09D 11/101; H01B 1/22
(Continued)

(56) References Cited

U.S. PATENT DOCUMENTS 9,870,843 B2 1/2018 Zhang et al.
2007/0144888 A1* 6/2007 Clarke ................. G02B 26/004
204/192.1
(Continued)

FOREIGN PATENT DOCUMENTS

CN 106164142 11/2016
CN 107201089 9/2017
(Continued)

OTHER PUBLICATIONS

Sun et al., "Conductivity Enhancement of Thermal Interface Material via Capillary Attraction," 2016 IEEE 66th Electronic Components and Tech. Conference, pp. 1409-1414.
(Continued)

Primary Examiner — James E McDonough
(74) Attorney, Agent, or Firm — McDonald Hopkins LLC

(57) ABSTRACT

The present invention relates to highly conductive, printable inks for highly stretchable soft electronics, a process for their manufacture as well as a process for producing highly stretchable soft electronics.

12 Claims, 6 Drawing Sheets

(51) Int. Cl.
  *C09D 11/101* (2014.01)
  *C09D 11/52* (2014.01)
  *H01B 1/22* (2006.01)
(58) Field of Classification Search
  USPC .............. 106/31.01, 31.13, 31.6, 31.92
  See application file for complete search history.

(56) References Cited

U.S. PATENT DOCUMENTS

| | | | | |
|---|---|---|---|---|
| 2010/0084599 | A1* | 4/2010 | Lewis | C09D 17/006 |
| | | | | 252/62.2 |
| 2011/0233458 | A1* | 9/2011 | Texter | H01B 1/20 |
| | | | | 977/932 |
| 2017/0263945 | A1* | 9/2017 | Li | H01M 8/0239 |
| 2019/0076921 | A1* | 3/2019 | Oyama | B22F 9/24 |

FOREIGN PATENT DOCUMENTS

| | | | | |
|---|---|---|---|---|
| EP | 3267491 | | 1/2018 | |
| EP | 3267491 | A1 * | 1/2018 | ............. C09D 11/52 |
| WO | WO-2018006990 | A1 * | 1/2018 | ............. C09D 11/52 |

OTHER PUBLICATIONS

Hu et al., "A low-cost, printable, and stretchable strain sensor based on highly conductive elastic composites with tunable sensitivity for human motion monitoring," Nano Research, Tsinghua University Press, vol. 11, No. 4, pp. 1998-0124, 2018.

Haul et al., "Structure of capillary suspensions and their versatile applications in the creation of smart materials," Mrs Communications, vol. 8, No. 02, pp. 332-342. 2018.

Patent Cooperation Treaty (PCT), International Search Report and Written Opinion for Application PCT/EP2019/075692 filed on Sep. 24, 2019, mailed Nov. 25, 2019, International Searching Authority, EP.

Sun, Hongye, Xinfeng Zhang, and Matthew MF Yuen, "Enhanced conductivity induced by attractive capillary force in ternary conductive adhesive", Composites Science and Technology 137 (2016): 109-117).

Matsuhisa, N., et al., ("Printable elastic conductors by in situ formation of silver nanoparticles from silver flakes", Nature materials, 2017. 16(8), pp. 834 ff,).

Araki, Teppei, et al., "Printable and stretchable conductive wirings comprising silver flakes and elastomers", IEEE Electron Device Letters 32.10 (2011): 1424-1426.

* cited by examiner

Pure IL    IL/water mixture    Pure water

119° ± 1°    126° ± 2°    170° ± 1°

(a)

(b)

(a)

(b)

(a)

(b)

(c)

HIGHLY CONDUCTIVE, PRINTABLE INK FOR HIGHLY STRETCHABLE SOFT ELECTRONICS

CROSS-REFERENCE TO RELATED APPLICATION

This application is a 35 U.S.C. 371 national stage filing of PCT Application No. PCT/EP2019/075692 filed on Sep. 24, 2019, entitled "HIGHLY CONDUCTIVE, PRINTABLE INK FOR HIGHLY STRETCHABLE SOFT ELECTRONICS," which claims priority to European Patent Application No. 18200100.8, filed on Oct. 12, 2018, each of which are incorporated herein in their entirety by reference.

The present invention relates to highly conductive, printable inks for highly stretchable soft electronics, a process for their manufacture as well as a process for producing highly stretchable soft electronics.

The development of highly conductive, printable and elastic conductors promises the fabrication of soft electronic components such as sensors, integrated circuits or antennas and their application in bioelectronics, wearable devices and soft robotics. Creating the next generation of soft electronics requires distinct features of the ink, including mechanical flexibility and stretchability, conductivity adjustable to application demands, and printability compatible with established (screen printing, dispensing, slot die coating, spraying) as well as emerging printing and coating technologies (additive manufacturing such as direct ink writing).

One of the major challenges encountered by existing stretchable conductive inks is the trade-off between electrical and mechanical properties, e.g. addition of a plasticizer in a conducting polymer guaranteeing good stretchability deteriorates conductivity, high volume fraction of conductive particles embedded in a flexible polymer provides high conductivity but reduces deformability. Hence, developing highly conductive yet highly stretchable and printable inks that enable large-area and high throughput production, high printing resolution, easy processing, and cost-effectiveness is of high demand.

Although many methods have been proposed to produce conductive electronic materials, few can satisfy the requirements of mechanical stretchability, electronic conductivity and printability simultaneously. WO 2018/006990 describes a highly conductive, printable paste resulting from the formation of capillary bridges among conductive particles. However, the paste is rigid after drying and sintering and not compatible with soft substrates.

U.S. Pat. No. 9,870,843 B2 shows that the capillary force can be used to reduce particle consumption when making conductive polymer composites particles since particle self-assembly driven by the capillary force yields a low percolation threshold. Another report shows that capillary forces can enhance electrical conductivity of silver epoxy adhesives, i.e. a high conductivity is achieved at low particle loading (Sun, Hongye, Xinfeng Zhang, and Matthew MF Yuen, "Enhanced conductivity induced by attractive capillary force in ternary conductive adhesive", Composites Science and Technology 137 (2016): 109-117). However, printability and stretchability are not addressed in these publications.

Matsuhisa, N., et al., ("Printable elastic conductors by in situ formation of silver nanoparticles from silver flakes", Nature materials, 2017. 16(8), pages 834 ff) describes an approach to achieve high conductivity as well as high stretchability at low silver content via incorporating a surfactant and in-situ growing nano-sized conductive particles.

In U.S. Pat. No. 9,460,824, a stretchable and conductive film is formed through annealed silver nanoparticles deposited on the substrate. However, usage of nanomaterials in large scale production is restricted by the complicated preparation steps of both materials and films.

Araki et al. report highly stretchable wirings made from silver/polyurethane composite with stretchability up to 600% (Araki, Teppei, et al., "Printable and stretchable conductive wirings comprising silver flakes and elastomers", IEEE Electron Device Letters 32.10 (2011): 1424-1426). However, cyclic durability of the ink is not addressed, which is critical for applications.

Various commercial products deliver good conductivity and flexibility, i.e. CI-1036 stretchable silver ink from Engineered Materials Solutions, Inc. Still, it can only be stretched up to 100%. DuPont released a series of stretchable electronic inks for garments in 2015, such as PE873 and PE874 silver conductor, which are formulated by suspending silver flakes in an elastomer. These products exhibit low electrical conductivity ($\sim 10^{-2}$ S/cm) at low silver loading of 12 vol %-15 vol %. Besides, no stretchability is specified for these inks.

Thus, the technical objective underlying the present invention is to provide a simple and economic way to produce a highly conductive and printable ink providing high deformability and stretchability in the corresponding printed and cured device for application in soft electronics. The ink fabrication should be compatible with state of the art unit operations and should allow for large scale production.

This objective and others which will become apparent from the following disclosure, are achieved by the present invention which makes use of the capillary suspension phenomenon to design highly conductive and printable inks providing high deformability and stretchability in the corresponding printed and cured devices for applications in soft electronics.

In particular, the present invention relates to a highly conductive and printable ink, comprising a conductive solid phase and two immiscible fluid phases as defined in claim 1.

BRIED DESCRIPTION OF THE DRAWINGS

Figure 1:
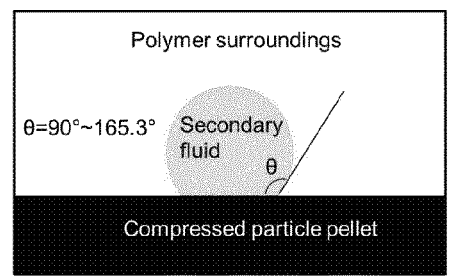
FIG. 1 shows a schematic of the three phase contact angle θ of secondary fluid on particles within a polymer phase.

Hydrophobic silver (Ag) particles, 5 to 40 volume percent (vol %), preferably 8 to 20 vol %, are incorporated into the hydrophobic primary polymer phase. Thus, compatibility between filler and polymer matrix is guaranteed for good mechanical stability as well as high electrical conductivity of the cured soft electronics.

The primary liquid phase includes a polymer base and its corresponding cross-linker and catalyst. Cross-linkable polydimethylsiloxane (PDMS) is used as soft polymer base responsible for stretchability. In order to cure the liquid PDMS polymer, cross-linker and catalyst according to the state of the art are incorporated. With respect to the amount of PDMS base, the cross-linker, 1 to 10 vol %, preferably 2 to 5 vol %, and the catalyst solution, 0.01 to 5 vol %, preferably 0.05 to 2 vol %, are adopted. The amount of cross-linker determines the crosslink density, which determines the mechanical strength and the maximum stretchability of the cured materials. The amount of catalyst controls the curing kinetics during polymerization. Cross-linkers and catalysts for PDMS polymers are well known in the art and commercially available.

The secondary fluid phase must be immiscible with the primary phase and should not wet the conductive solid phase. The amount of secondary fluid is quantified by a parameter ρ, which is defined as the volume ratio between secondary fluid and conductive solid phase.

$$\rho = \frac{\text{Volume of secondary fluid}}{\text{Volume of conductive solid}}$$

ρ falls in the range of 0.01 to 0.2, preferably 0.02 to 0.1. The amount of secondary fluid determines the particle network structure and hence the final conductivity.

To formulate the ink, silver particles are dispersed in the primary phase by mechanical stirring. After addition of the liquid secondary phase, a subsequent mixing step is followed to break up the secondary fluid phase into small droplets which connect silver particles into clusters, which further grow into a sample-spanning conductive network.

The three-phase system creates a capillary suspension, in which the suspended particles self-assemble into a percolating sample-spanning network due to the capillary force induced by the immiscible secondary fluid. The uncured ink remains stable and no sedimentation occurs even within 10 days. It can be printed using standard techniques such as screen printing, slot die coating or spraying or emerging additive manufacturing methods like direct ink writing which can be used for rapid prototyping complex 3D objects, e.g. pressure and strain sensors. After printing the desired electronic structures, the curing is activated either by moisture, thermal treatment (<200° C.) or UV radiation.

The cured samples exhibit low percolation threshold and high conductivity at low silver volume fraction. The reduced consumption of silver solids in the flexible polymer guarantees a high, unprecedented stretchability (~1000% maximum strain). Besides, it delivers a superior cyclic durability and maintains conductivity even after a large number of cycles (>1000 cycles at a cycling strain of 100%) exceeding the current state of the art. So far, highest values of stretchability reported in the literature are around 400%-500% (Matsuhisa, N., et al., "Printable elastic conductors by in situ formation of silver nanoparticles from silver flakes", Nature materials, 2017. 16(8), pages 834 ff.). However, the inks mentioned above show a low cyclic stability, and an abrupt resistance increase occurs after 750 cycles at a cycling strain of 50%.

The dispersion of the silver particles in the primary phase and addition of the secondary phase can be achieved using different state of the art mixing devices such as dissolvers, blenders, ball mills, three roll mills or non-contact planetary mixers.

The suspension of silver particles in the primary fluid is preferably achieved via a non-contact planetary mixing procedure employing rotational speeds in the range of 500 to 3000 rpm, preferably 1000 to 2500 rpm, at room temperature lasting for e.g. about 10 minutes and subsequent three roll milling at a rotational speed between 30 and 300 min$^{-1}$, preferably 30 to 80 min$^{-1}$ fining the agglomeration size down to about 5 μm. The secondary fluid phase is then added thereto in a subsequent non-contact planetary mixing step lasting for e.g. about 1 minute.

Preferably, the conductive silver particles have a medium particle size $d_{50}$ of 0.1 to 50 μm, determined by laser diffraction in accordance with DIN EN 725-5, ISO 13320.

Hydrophobic silver particles are added to guarantee a good dispersibility as well as good compatibility with the hydrophobic PDMS matrix, which is a key to achieve high stretchability and good cyclic stability, because poor compatibility would cause microscopic ruptures between silver flakes and the matrix deteriorating ink performance with respect to both mechanical and electrical properties. Hydrophobic silver particles are commercially available.

To be more specific, the reactive polydimethylsiloxane (PDMS) which is transformed into an elastomer by cross-linking, preferably has a kinematic viscosity between 100 cSt and 60,000 cSt, as determined by capillary viscometry in accordance with ISO 3015. These polymers are fluid and non-volatile at room temperature and the secondary fluid can be easily blended in. Two types of preferred PDMS which are cross-linkable and hydrophobic can be used in accordance with the present invention. One is vinyldimethylsiloxy-terminated PDMS which can be polymerized by addition cure:

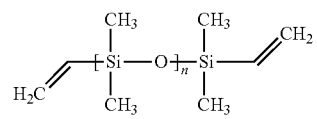

where n can vary between 50 and 2,000 corresponding to an average molecular weight between 6,000 and 120,000 g/mol.

The other one is silanol-terminated PDMS which can be polymerized by condensation cure:

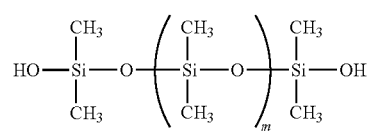

where m can vary between 50 and 1,800 corresponding to an average molecular weight between 4,000 and 110,000 g/mol.

As far as the secondary liquid phase immiscible with PDMS is concerned, basically, any non-wetting secondary fluid with three phase contact angle θ against the suspended silver particles ranging from 90° to 165.3° can create a capillary state capillary suspension (cf. Koos Erin and Norbert Willenbacher. *Soft Matter* 8.14 (2012): 3988-3994). The exact upper contact angle limit depends on the cluster structure and bridge volume, i.e. for some systems the maximum contact angle may be lower than the theoretical limit stated above. It should be noted that the three phase contact angle θ is a material property depending on two liquids as well as the solid phase of the ternary system. Particularly, the three phase contact angle is determined by the sessile drop method in accordance with ASTM Standard D7334. Ag particles are pressed into a condense pellet and immersed in the primary polymer phase. A secondary fluid droplet is squeezed out from a syringe loaded above and settles down on the Ag pellet. The typical droplet size used in contact angle measurements is between 1 and 10 microliters. Droplet shape is recorded by a camera and the three phase contact angle is determined by droplet profile fitting. FIG. 1 shows a schematic of the three phase contact angle θ of secondary fluid on particles within a polymer phase, θ should fall in the range between 90° and 165.3° to create a capillary state capillary suspension.

In the present invention, preferably, the ionic liquid (IL) may in particular contain a substituted or unsubstituted imidazolium cation, wherein the imidazolium cation of the salt is preferably in the 1- and 3-position or in the 1-, 2- and 3-position with ($C1$-$C_6$) alkyl groups. More preferably, the imidazolium cation is the 1-ethyl-3-methylimidazolium, 1,3-dimethylimidazolium or 1-butyl-3-methylimidazolium cation. The anion of the ionic liquid is usually a halide, perchlorate, pseudohalide, sulfate, phosphate, alkyl phosphate and/or a C1-C6 carboxylate ion, the halide ion being chloride, bromide and/or iodide ion, the pseudohalide ion being cyanide, thiocyanate and/or cyanate ion and the C1-C6 carboxylate ion being formate, acetate, propionate, butyrate, hexanoate, maleate, fumarate, oxalate, lactate and/or pyruvate.

Most preferably, 1-butyl-3-methylimidazolium iodide can be used:

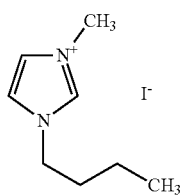

Figure 2:
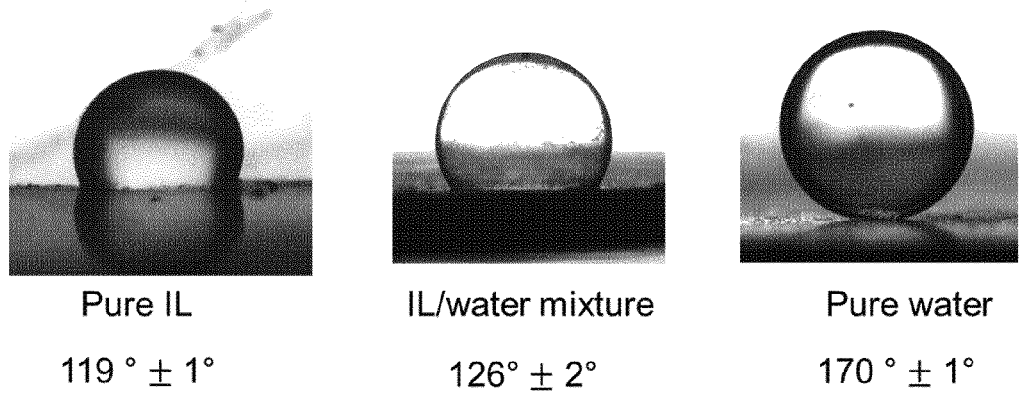
FIG. 2 shows the experimental images of three liquid droplets forming different contact angles on hydrophobic silver within the PDMS polymer phase.

For example, the IL, 1-butyl-3-methylimidazolium iodide, inferred as a secondary fluid, exhibits a three-phase contact angle of 119° on the hydrophobic silver used in this invention with PDMS as a primary phase. The three-phase contact angle can be adjusted by adding water or ethanol to the IL, e.g. a binary mixture of ionic liquid and water with weight ratio of 2:5 shows a three phase contact angle of 126°. Pure water has a high three-phase contact angle of 170° which is beyond the above mentioned θ range and hence water cannot be used to form a capillary suspension. FIG. 2 shows the experimental images of three liquid droplets forming different contact angles on hydrophobic silver within the PDMS polymer phase. Pure IL and the binary IL/water mixture can form capillary suspensions in PDMS while pure water cannot.

As mentioned above, the inks according to the present invention can be used for producing highly stretchable soft electronics by applying the obtained uncured inks on a soft substrate, preferably by means of dispensing, screen printing, slot die coating, spraying or direct ink writing, and then curing them. After printing the desired structures, curing is activated by moisture for condensation cure or by thermal treatment (<200° C.) or UV radiation for addition cure, which finally results in a stretchable and deformable electrical device.

The inks of the present invention are usable for the following kind of applications:
  (i) Sensors: Biomedical sensors for wearable health monitoring for recording real-time data to reflect the physiological condition of human beings. The inks of the present invention can be used as the candidate of sensing materials.
  (ii) Soft robotics: Artificial skin or E-skin enables the robotics with the ability of sensing the pressure, strain, temperature. Data gloves based on the strain sensing captures the motion of robotic fingers.
  (iii) Wireless devices: Wireless and portable communication devices such as mobile phones are rapidly growing and the antenna in telecommunication systems must be compatible with the soft electronic packaging. The printable and conductive inks of the present invention allow for complex antenna design and radio frequency to propagate.
  (iv) Flexible Solar cell: Flexible thin-film photovoltaic cells are a low cost means to collect solar energy. The inks of the present invention material can provide good contacting of cells on flexible substrates at simultaneously low silver consumption. This is decisive in this future mass market.
  (v) Soft electronics: The inks of the present invention can be printed into electric circuits integrated in soft robotics, electronic paper and flexible displays.

The invention is described in more details, but not limited to the following examples.

EXAMPLES

Figure 3:
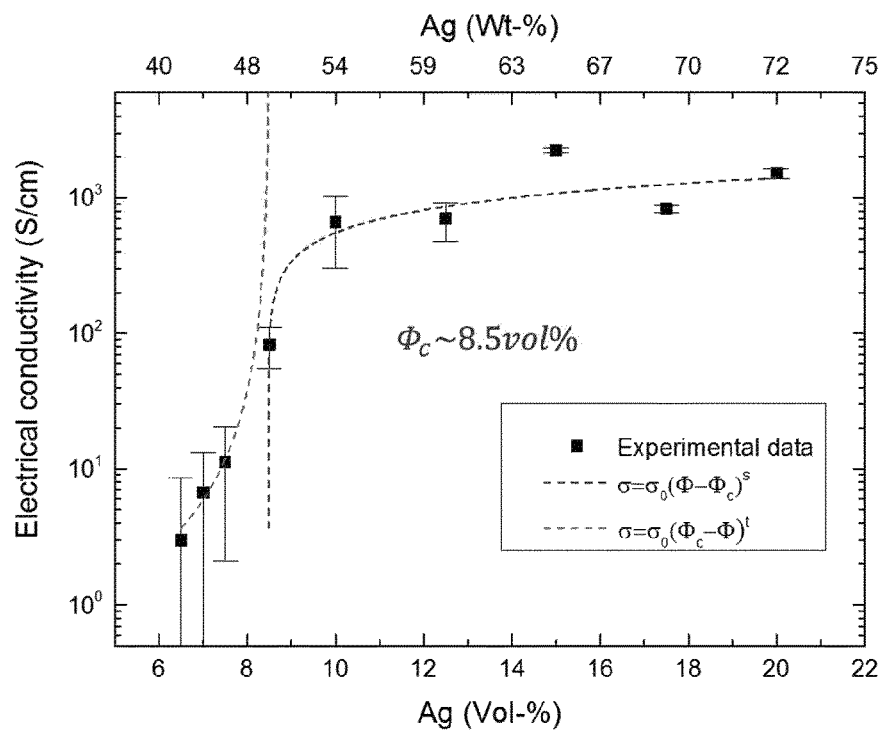
FIG. 3 shows the electrical conductivity vs. Ag particle loading for binary and capillary Ag-PDMS.

In one example, Ag flakes [SF-01C, Great wall precious metals Co.] are taken as hydrophobic, conductive particles and polydimethylsiloxane (PDMS) [AB109360, abcr GmbH] along with its cross-linker [Poly(dimethylsiloxane-co-methylhydrosiloxane), trimethylsilyl terminated, Sigma-Aldrich] and catalyst [Tris(dibutylsulfide) Rhodium trichloride, Gelest Inc] is used as soft polymer. Ag flakes are uniformly distributed in the PDMS matrix via non-contact planetary mixing and three roll milling. Then, an aqueous 1-butyl-3-methylimidazolium iodide solution (weight ratio of 2:5 between IL and water) immiscible with the PDMS matrix is added to the Ag-PDMS suspension as the secondary fluid phase. The volume ratio ρ between secondary fluid and silver solid phase varies between 0.02 and 0.08, making sure that the ink is curable and no bubbles remain inside the cured sample during evaporation of the secondary liquid. Another mixing step follows to break up the secondary fluid into small droplets promoting the formation of silver particle clusters. Clusters containing small secondary fluid droplets drive the self-organization of Ag flakes into a conductive network at a low percolation threshold. FIG. 3 shows the electrical conductivity vs. Ag particle loading for binary and capillary Ag-PDMS. The percolation threshold 0, was determined by fitting a power-law relationship shown as:

$$\sigma = \sigma_0 (\phi - \phi_c)^s \text{ where } \phi > \phi_c$$

where $\sigma$ is the conductivity of the composites, $\phi$ is the volume fraction of silver particles, $\phi_c$ is the volume fraction of silver particles at the percolation threshold, s is the critical exponent, and $\sigma_0$ is a prefactor. The percolation threshold was determined as $\phi_c$=6.4 vol. % for capillary Ag-PDMS and $\phi_c$=23 vol. % for the corresponding binary Ag-PDMS mixture.

Notably, the initial conductivity is as high as 1100 S/cm at 15 vol % silver, while the corresponding conventional ink without capillary bridging is still insulating at this particle loading. Furthermore, the Ag flakes act like platelets that slide over each other when stretched. This allows the conductive path to be maintained while being stretched.

Figure 4:
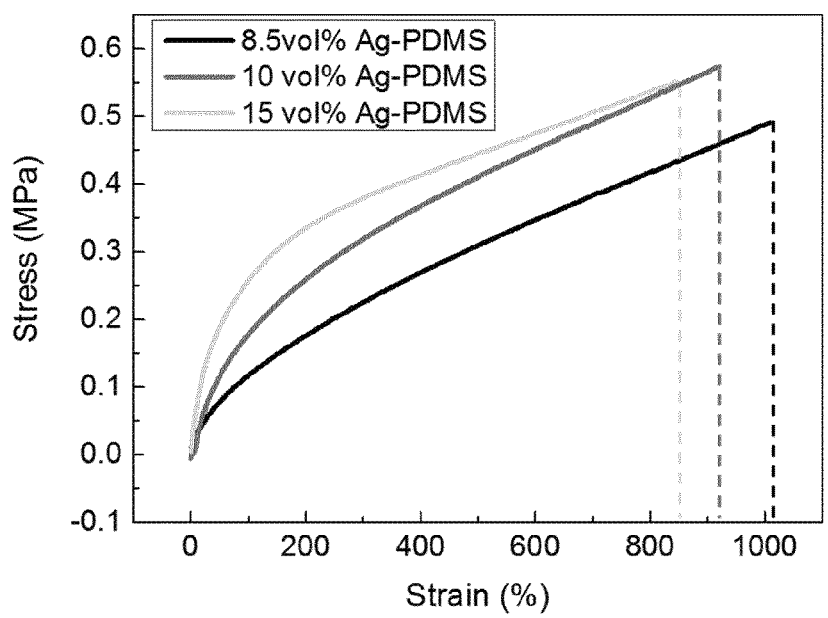
FIG. 4 shows stress-strain curves from tensile tests on the dog-bone shaped specimen of cured inks with three different Ag loadings.
Figure 5:
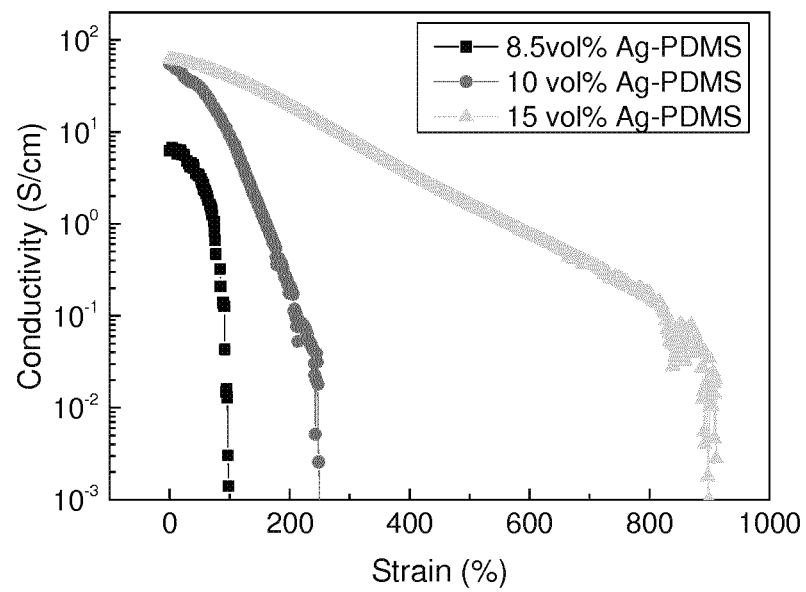
FIG. 5(a) shows the electro-mechanical properties of Ag-PDMS with three different Ag loadings.
FIG. 5(B) shows the electro-mechanical properties of 15 vol% Ag-PDMS.
Figure 5:
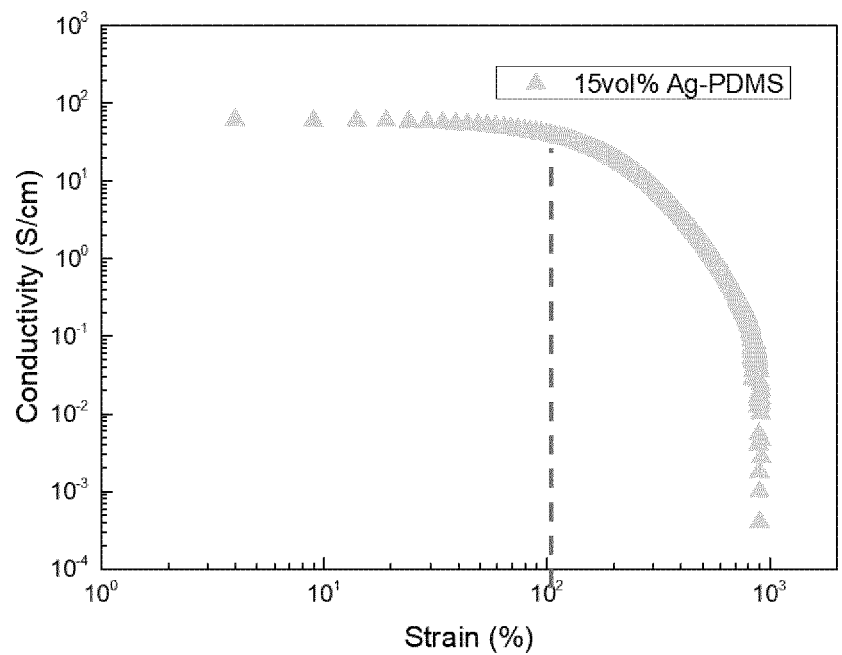

Tensile tests were conducted to determine the stretchability of the inks. Dog bone shaped specimen were printed and then cured at 130° C. for 1 hour. After curing, tensile strain at failure as high as 1000% is observed for 8.5 vol % Ag-PDMS. FIG. 4 shows stress-strain curves from tensile tests on the dog-bone shaped specimen of cured inks with three different Ag loadings. The maximum strain is up to 1000% for 8.5 vol % Ag-PDMS. The sensitivity of conductivity change to strain depends on the Ag loading, as shown in FIG. 5a. The PDMS ink including 15 vol % Ag maintains conductive up to 800% of strain. However, the conductivity retains a most constant level of conductivity up to 100% and then conductivity decreases by orders of magnitude (see FIG. 5b). This allows for its application either as highly conductive circuit (as long as strain is <100%) or as a highly susceptible strain sensor for strain >100%. The strain range in which the ink's conductivity strongly changes with deformation, can be adjusted via its Ag content (see FIG. 5a). Accordingly, FIG. 5(a) shows the electro-mechanical properties of Ag-PDMS with three different Ag loadings. Conductivity change is more sensitive to strain at low Ag loading. The ink of 15 vol % Ag-PDMS is still conductive after being stretched to 800%. FIG. 5(b) shows that conductivity of 15 vol % Ag-PDMS does not drop when stretched up to 100% strain.

Figure 6:
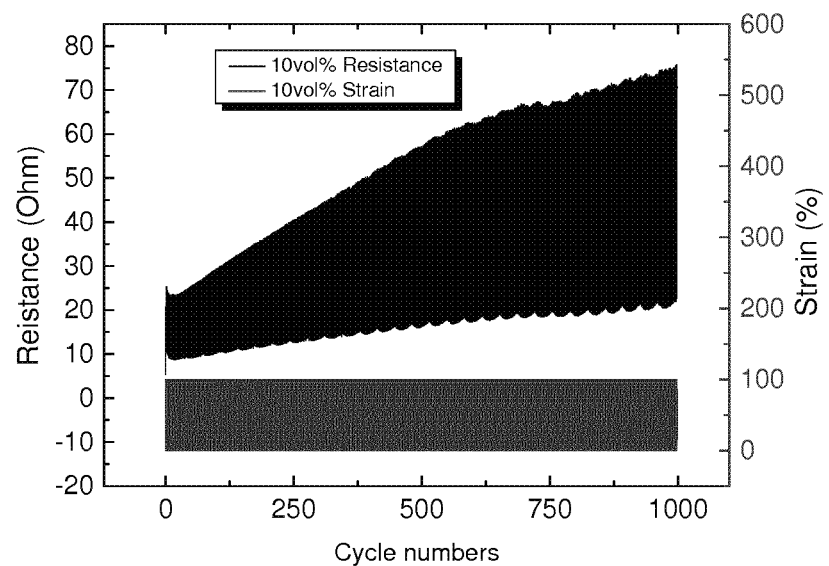
FIG. 6a shows the cyclic durability of 10 vol% Ag-PDMS during cycling load at 100% strain amplitude and a frequency of 0.012 Hz.
FIG. 6b shows the cyclic resistance change during the first 30 cycles for the 10vol% Ag-PDMS sample (zoomed area of the rectangle in FIG. 6a)
FIG. 6c shows the resistance change of 10 vol% Ag-PDMS at two cycles of stretching/releasing response.
Figure 6:
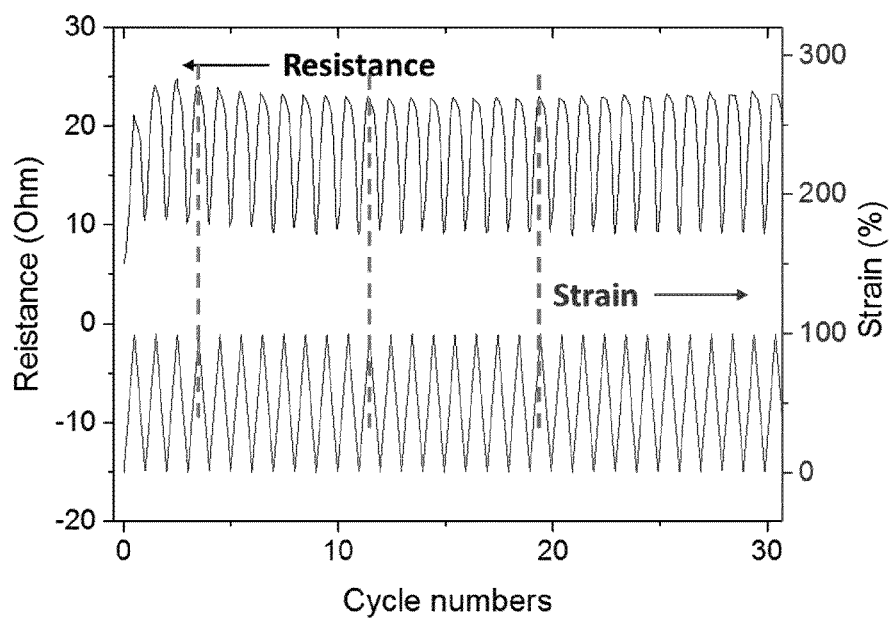
Figure 6:
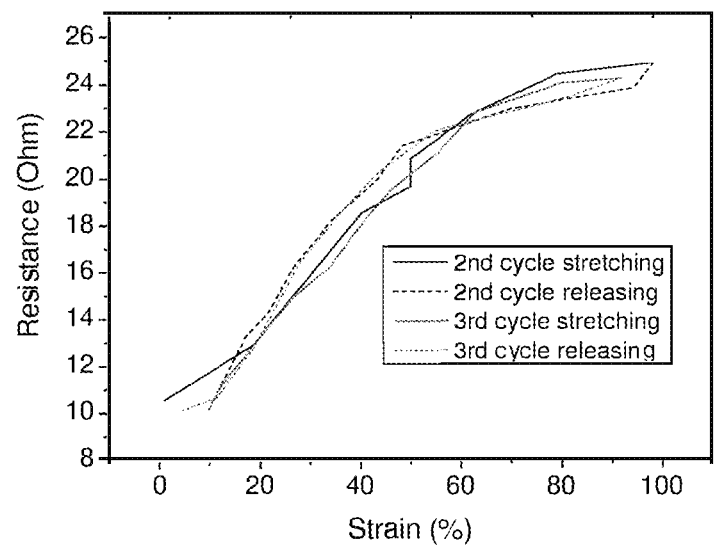

Cyclic tests were conducted to determine the durability of the inks. A pure PDMS film of dog-bone shape was first prepared. Two electrodes of highly conductive silver paste were printed onto the two ends of the dog-bone shape. Then the ink was printed in the form of a straight filament between two electrodes and cured at 130° C. for 1 hour. FIG. 6a shows the cyclic durability of 10 vol % Ag-PDMS during cycling load at 100% strain amplitude and a frequency of 0.012 Hz. The applied strain cycles are shown in blue and the black line represents the recorded electrical resistance in response to the applied strain. After 1000 cycles, the ink maintains a low resistance of 80 Ohm, i.e. it increased by only about a factor of 4 compared to the initial state.

The high cyclic durability is important for applications such as elastic circuits exposed to a large number of deformations during usage. FIG. 6b shows the cyclic resistance change during the first 30 cycles for the 10 vol % Ag-PDMS sample (zoomed area of the rectangle in FIG. 6a). Resistance responds instantaneously to the applied strain and no phase lag is observed between these variables, as shown by the dashed red lines, which implies a good recoverability and endurance of ink properties. FIG. 6c shows the resistance change of 10 vol % Ag-PDMS at two cycles of stretching/releasing response. The ink exhibits a fully recoverable electrical resistance with negligible hysteresis upon stretching and releasing the strain.

Figure 7:
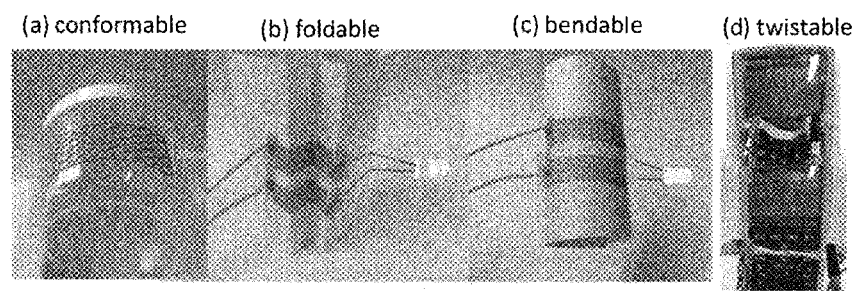
FIG. 7 are images showing the characteristics of the inks of the present invention.

FIG. 7 demonstrates the characteristics of the inks of the present invention: namely being printable, flexible and conductive: a honeycomb structure was 3D printed with an ink of the present invention. It conforms well to a round bottle (a); a circuit was printed on paper. Even the folded (b) and rolled (c) circuit can still light up a LED; a bandage printed from an ink of the present invention was twisted with no change in resistance (d).

Figure 8:
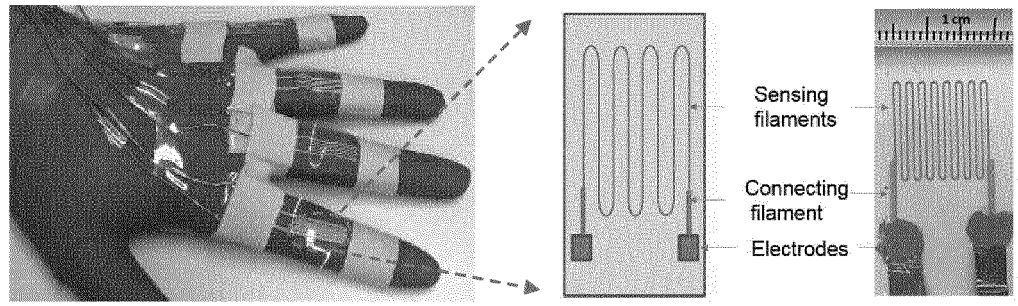
FIG. 8a shows a glove with four integrated strain sensors, the serpentine design of the strain sensor, as well as a sensor prototype printed from a 9 vol.% Ag-PDMS capillary ink.
FIG. 8b shows the performance of the sensors on the glove of FIG. 8a during finger bending.
FIGS. 8c shows the performance of the sensors made from capillary Ag-PDMS.
Figure 8:
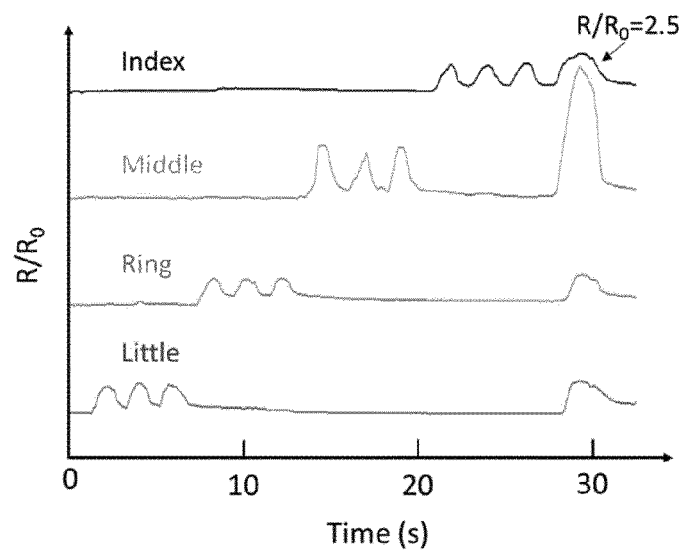
Figure 8:
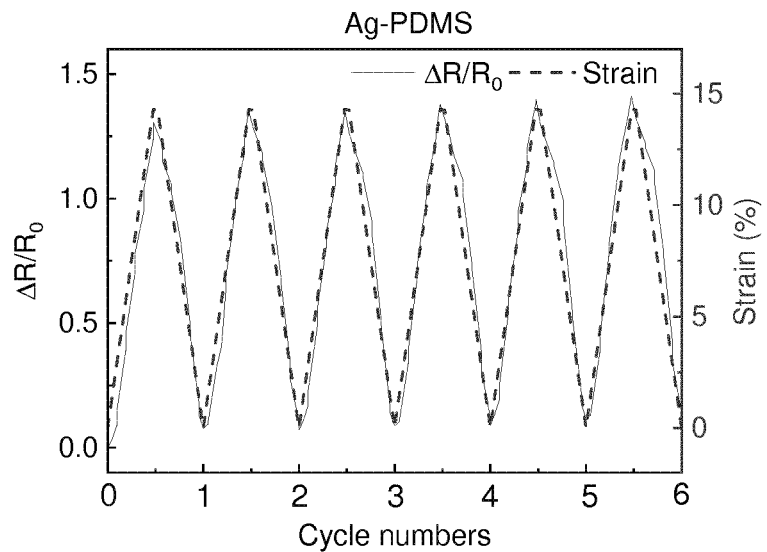

The performance of Ag-PDMS ink is further demonstrated by 3D printed strain sensors. FIG. 8a shows a glove with four integrated strain sensors, the serpentine design of the strain sensor, as well as a sensor prototype printed from a 9 vol. % Ag-PDMS capillary ink. Copper foils were used as electrodes. The sensors were printed on a substrate made from the same PDMS as used for the conductive ink to avoid delamination. FIG. 8b shows the performance of the sensors on the glove during finger bending. Each finger was bent three times separately and afterwards all fingers were bent simultaneously. The $R/R_0$ signal confirms that the sensors respond to the bending without delay and fully recover after the strain is released. FIG. 8c shows the performance of the sensors made from capillary Ag-PDMS. The relative resistance change $\Delta R/R_0$ is shown for 6 cycles of triangle strain after two initial cycles. The strain sensor exhibits repeatable and in-phase responses to the applied strain. The sensitivity of the sensor was characterized by the gauge factor (GF)= $(\Delta R/R_0)/\varepsilon$. Our sensors show a GF of 9.1 for 9 vol. % Ag-PDMS at a strain of 15%, which is comparable to other strain sensors made from PDMS composites but including higher filler content [Hu, Y., et al., Nano Research, 2018. 11(4): p. 1938-1955.].

The invention claimed is:
1. A highly conductive and printable ink, comprising:
   (i) 5 to 40 vol % of conductive hydrophobic silver particles, with respect to the total volume of ink, as conductive solid phase,
   (ii) a liquid primary phase comprising, as a polymer base, a cross-linkable hydrophobic polydimethylsiloxane (PDMS) which is capable to become an elastomer by cross-linking, and further including a cross-linker in an amount of 1 to 10 vol % and a catalyst solution in an amount of 0.01 to 5 vol %, with respect to the PDMS base, and
   (iii) a liquid secondary phase based on an ionic liquid, with a volume ratio ρ of 0.01 to 0.2 between liquid secondary phase and conductive solid phase,
   wherein the liquid secondary phase is immiscible with the liquid primary phase and does not wet the conductive solid phase, so that the three-phase system creates a capillary suspension.

2. The ink according to claim 1, wherein the conductive hydrophobic silver particles have a medium particle size d50 of 0.1 to 50 µm, measured by laser diffraction in accordance with DIN EN 725-5, ISO 13320.

3. The ink according to claim 2, wherein the cross-linkable polydimethylsiloxane (PDMS) has a kinematic viscosity between 100 cSt and 60,000 cSt, as determined by capillary viscometer in accordance with ISO 3015.

4. The ink according to claim 1, wherein the cross-linkable hydrophobic PDMS is selected from a vinyldimethylsiloxy-terminated PDMS for addition cure:

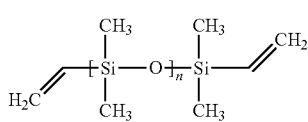

wherein n is from 50 to 2,000,
or a silanol-terminated PDMS for condensation cure,

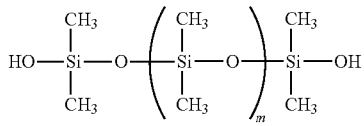

where m is from 50 and 1,800.

5. The ink according to claim 1, wherein the ionic liquid contains a substituted or unsubstituted imidazolium cation, wherein the imidazolium cation of the salt is preferably in the 1- and 3-position or in the 1-, 2- and 3-position with (C1-C6) alkyl groups, and the anion of the ionic liquid is a halide, perchlorate, pseudohalide, sulfate, phosphate, alkyl phosphate and/or a C1-C6 carboxylate ion.

6. The ink according to claim 5, wherein the imidazolium cation is selected from the 1-ethyl-3-methylimidazolium, 1,3-dimethylimidazolium or 1-butyl-3-methylimidazolium cation.

7. The ink according to of claim 1, wherein the ionic liquid contains 1-butyl-3-methylimidazolium iodide, 1-butyl-3-methylimidazolium chloride, 1-butyl-3-methylimidazolium bromide

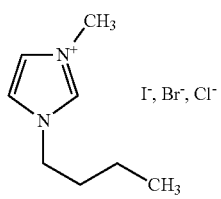

8. A process for producing a highly conductive and printable ink according to of claim 1, comprising:

mixing of (i) 5 to 40 vol % of conductive hydrophobic silver particles as conductive solid phase, (ii) a liquid primary phase comprising, as a polymer base, a cross-linkable hydrophobic polydimethylsiloxane (PDMS) which is capable to become an elastomer by cross-linking, and further including a cross-linker in an amount of 1 to 10 vol % and a catalyst solution in an amount of 0.01 to 5 vol %, with respect to the PDMS base, and (iii) a liquid secondary phase based on an ionic liquid, with a volume ratio ρ of 0.01 to 0.2 between liquid secondary phase and conductive solid phase, wherein the liquid secondary phase is immiscible with the liquid primary phase and does not wet the conductive solid phase, so that the three-phase system creates a capillary suspension.

9. The process according to claim 8, wherein the silver particles are dispersed in the liquid primary phase by mechanical stirring, followed by adding the liquid secondary phase and a subsequent mixing step to break up the liquid secondary phase into droplets.

10. A process for producing highly stretchable soft electronics by applying the uncured inks according to claim 1 on a soft substrate, preferably by means of dispensing, screen printing, slot die coating, spraying or direct ink writing, and then curing them, to yield a stretchable and deformable electrical device.

11. The process according to claim 10, wherein, after printing on the desired electronic structures, the curing is activated either by moisture, thermal treatment or UV radiation.

12. An article comprising the highly conductive and printable ink according to claim 1, wherein the article is selected from a sensor, a soft robotic, a wireless device, a flexible solar cell, or a soft electronic.

* * * * *